(12) United States Patent
Smith et al.

(10) Patent No.: US 6,396,604 B1
(45) Date of Patent: *May 28, 2002

(54) DARK PULSE TDMA OPTICAL NETWORK

(75) Inventors: Kevin Smith, Erwarton; Julian Kazimierz Lucek, Ipswich; Danny Robert Pitcher, Ipswich; Terrence Widdowson, Ipswich; David Graham Moodie, Ipswich; Andrew David Ellis, Ipswich, all of (GB)

(73) Assignee: British Telecommunications plc, London (GB)

( * ) Notice: Subject to any disclaimer, the term of this patent is extended or adjusted under 35 U.S.C. 154(b) by 0 days.

This patent is subject to a terminal disclaimer.

(21) Appl. No.: 09/043,409

(22) PCT Filed: Feb. 25, 1997

(86) PCT No.: PCT/GB97/00520

§ 371 (c)(1),
(2), (4) Date: Mar. 19, 1998

(87) PCT Pub. No.: WO97/31436

PCT Pub. Date: Aug. 28, 1997

Related U.S. Application Data

(63) Continuation-in-part of application No. 08/699,657, filed on Aug. 19, 1996, now Pat. No. 5,784,185.

(30) Foreign Application Priority Data

| Feb. 26, 1996 | (EP) | 96301277 |
| Feb. 26, 1996 | (GB) | 9604020 |
| Jun. 26, 1996 | (EP) | 96304694 |
| Jun. 26, 1996 | (GB) | 9613345 |
| Oct. 2, 1996 | (EP) | 96307207 |
| Oct. 2, 1996 | (GB) | 9620502 |

(51) Int. Cl.[7] ........ H04B 10/00; H04B 10/12; H04B 10/18

(52) U.S. Cl. ........ 359/136; 359/173; 359/188; 359/195; 359/177; 359/179

(58) Field of Search ........ 359/136, 189, 359/140, 137, 138, 158, 173, 188, 195, 179, 177

(56) References Cited

U.S. PATENT DOCUMENTS 5,073,980 A  12/1991  Prucnal et al.

(List continued on next page.)

FOREIGN PATENT DOCUMENTS

CA  2093986  10/1993

(List continued on next page.)

OTHER PUBLICATIONS

Ellis, A.D. "690 node global OTDM network demonstration" Electronic Letters, Jul. 1995, vol. 31, No. 14, Figure 1, pp. 1171–1172.*

(List continued on next page.)

Primary Examiner—Leslie Pascal
Assistant Examiner—Agustin Bello
(74) Attorney, Agent, or Firm—Nixon & Vanderhye P.C.

(57) ABSTRACT

An optical network includes a number of nodes coupled to an optical transmission medium, such as an optical fiber bus. Each of the nodes includes a dark pulse generator. Different nodes output dark pulses in different time slots onto the transmission medium, forming a dark pulse OTDM (optical time division multiplexed) signal. The network may have a re-entrant bus topology.

15 Claims, 8 Drawing Sheets

U.S. PATENT DOCUMENTS

| | | | |
|---|---|---|---|
| 5,434,693 A | | 7/1995 | Tanaka et al. |
| 5,477,375 A | | 12/1995 | Korotky et al. |
| 5,530,585 A | * | 6/1996 | Reid .......................... 359/344 |
| 5,625,479 A | * | 4/1997 | Suzuki ....................... 359/135 |
| 5,737,110 A | * | 4/1998 | Suzuki ....................... 359/161 |
| 5,751,455 A | | 5/1998 | Shibutani et al. |
| 5,784,185 A | * | 6/1998 | Smith et al. ................ 359/136 |
| 5,786,918 A | | 7/1998 | Suzuki et al. |
| 5,892,608 A | * | 4/1999 | Suzuki ....................... 359/189 |

FOREIGN PATENT DOCUMENTS

| | | |
|---|---|---|
| EP | 266 870 | 5/1988 |
| EP | 0 556 974 A2 | 8/1993 |
| EP | 0 573 752 A1 | 12/1993 |
| FR | 2 715 524 | 7/1995 |
| WO | 92 07430 | 4/1992 |
| WO | 96 31029 | 10/1996 |

OTHER PUBLICATIONS

Harper, P. "Soliton transmission over 2700Km using an in–fiber Bragg grating filter to give Gordon–Haus jitter reduction", IEEE 1996, pp8/1–8/4.*

Barry, L. "A high speed optical star network using TDMA and all–optical demultipling techniques", IEEE Journal on Selected Area in Communications, vol. 14, No. 5, Jun. 1996, pp. 1030–1038.*

Co–pending Application Serial No. 08/913,708.

Ellis, A. D. et al., "Transmission of a True Single Polarisation . . . ", Electronics Letters, vol. 29, No. 11, May 27, 1993, pp. 990–992.

Ellis, A. D. et al., "Three–Node 40 Gbit/s OTDM Network . . . ", Electronics Letters, vol. 30, No. 16, Aug. 4, 1994, pp. 1333–1334.

Ellis, A. D. et al., "Compact 40 Gbit/s Optical Demultiplexer . . . ", Electronics Letters, vol. 29, No. 24, Nov. 25, 1993, pp. 2115–2116.

Kawanishi, S. et al., "All–Optical Time Division . . . ", Electronics Letters, vol. 30, No. 20, Sep. 29, 1994, pp. 1697–1698.

Patrick, D. M. et al., "Bit–Rate Flexible All–Optical . . . ", GCOC 1993, 3 pgs.

Suzuki, Masatoshi et al., "Long–Distance Soliton Transmission . . . ", IEICE Trans. Electron., vol. E78–C, No. 1, Jan., 1995, pp. 12–20.

Swartzlander, Jr., G. A., "Dark–Solution Prototype Devices: Analysis . . . ", Optics Letters, vol. 17, No. 7, Apr. 1, 1992, pp. 493–495.

IEEE Photonics Technology Letters, vol. 6, No. 9, Sep. 1994, New York, US, pp. 1139–1141, Cai et al, "Demonstration of photonic packet–switched ring network with optically transparent nodes".

21$^{ST}$ European Conference on Optical Communications (ECOC '95), Sep. 17–21, 1995, Brussels, BE, pp. 299, 302, Suzuki et al, "Dark pulse generation and detection using bright–dark conversion".

IEEE Photonics Technology Letters, vol. , No. 4, Apr. 1993, New York, US, pp. 482–485, Koai et al, "Nonregenerative photonic dual bus with optical amplifiers".

* cited by examiner

DARK PULSE TDMA OPTICAL NETWORK

RELATED APPLICATION

This is a continuation-in-part of earlier commonly assigned application Ser. No. 08/699,657 filed Aug. 19, 1996 (now issued as U.S. Pat. No. 5,784,185 on Jul. 21, 1998).

BACKGROUND OF THE INVENTION

1. Field of the Invention

The present invention relates to an optical network for carrying TDMA (Time Division Multiple Access) signals and to transmitters and receivers for use in nodes of such a network.

A network embodying the present invention might be used, for example, as a local area network (LAN) for interconnecting computer systems. The increasing power of computer systems in terms of processor speeds and storage capacity has made it possible for conventional personal computers to handle multimedia applications involving real time video and animation and computer graphics. The high bandwidth data associated with such applications place heavy demands on the network and the performance of conventional LANs has failed to keep pace.

2. Related Art

An optical network using synchronous TDMA potentially offers a far higher bandwidth, and so might be used as a high speed LAN to replace a conventional LAN. However, in existing optical networks, while signal transmission has been carried out in the optical domain, in practice some electronic circuits have been required for such functions as channel selection. It has been recognised that such electronic components of the network infrastructure constitute a bottle-neck restricting the performance of the network.

"A High Speed Broadcast and Select TDMA network Using All-Optical Demultiplexing", L. P. Barry et al, ECOC '95 pp 437–440, describes an experimental OTDM network. At the receivers in the network nodes, an optical clock signal is detected and a variable delay applied in the electrical domain to the detected clock signal to select a particular TDMA channel. After pulse shaping, the signal is taken back into the optical domain by driving a local optical source, a DFB laser, which produces an optical signal for use in a subsequent all-optical switching stage.

The paper by Prucnal et al, "Ultrafast all-optical synchronous multiplex access fibre networks", IEEE Journal on Selected Areas in Communications, SAC-4, no. 9, December 1986 proposes an alternative approach in which different delays, and hence different TDMA channels, are selected in the optical domain. The optical signal is split between different paths each having a different characteristic delay and an electro-optic gate in each path is controlled so that the signal passes only through the path having the desired delay.

SUMMARY OF THE INVENTION

According to a first aspect of the present invention, there is provided an optical network comprising:
a) an optical transmission medium; and
b) a plurality of nodes connected to the optical transmission medium, each of the plurality of node including a respective dark pulse generator which is coupled in-line with the optical transmission medium and in series with the others of the dark pulse generators and which is arranged to generate dark pulses in an optical signal carried on the transmission medium.

In this specification, a "dark pulse" is a temporal gap, or region of reduced intensity radiation, in an essentially continuous burst of optical radiation, or light beam. An advantage of using dark pulses in place of bright pulses is that optical signal generation is simplified, as will be discussed in the subsequent description. Also, while pulse alignment remains important for dark pulse OTDM, to minimise cross-talk, the extinction ratio necessary for successful dark pulse OTDM transmission is typically smaller than that required for bright pulse OTDM.

Preferably each node further comprises a variable delay stage which is arranged to apply a variable delay to a network clock signal in the electrical domain and which is connected at its output to the dark pulse generator.

The inventors have found it to be particularly advantageous to use in combination dark pulse generation and channel selection in the electrical domain. This further simplifies node structures, whilst enabling effective operation at high bit rates, for example at 40 Gbit/s.

Preferably each node further comprises a clock receiver for receiving a network clock signal carried on the optical transmission medium, the clock receiver including a photo-electric detector for converting the clock signal to the electrical domain.

Preferably the electro-optic modulator is an electro-absorption modulator (EAM).

The present inventors have found that significant advantages can be achieved by combining channel selection in the electrical domain with the use of an electro-optic switch with a fast non-linearity to read the selected channel. In particular, relatively high switching rates can be achieved without the power losses typically associated with all-optical channel selection. It is found to be particularly advantageous to use an EAM. The fast response time of such a device makes possible a switching window as short as a few picoseconds. The receiver as a whole is therefore capable of operating at bit rates of 40 Gbit/s or higher.

Preferably the receiver includes means for separating the clock signal in the optical domain from the received TDMA datastream. Preferably the said means for separating comprise a polarising beam splitter, in use the clock signal being marked by a different polarisation state to the TDMA datastream.

Preferably a first output of the means for separating is connected to the optical input of the electro-optic modulator, in use TDMA data passing from the first output to the modulator, and a second output of the means for separating is connected to the detector, in use optical clock signals passing from the second output to the detector.

Preferably an impulse generator is connected between the output of the variable delay stage and the control input of the electro-optic modulator.

The electro-optic modulator may require a drive signal having somewhat shorter pulses than those output by the delay stage. In this case advantageously some form of pulse shaping may be used, and in particular the output of the delay stage may be applied to an electrical impulse generator. This may be a device using step recovery diodes to generate short electrical pulses from a sine wave.

Preferably the variable delay stage comprises a plurality of logic gates, means connecting a first input of each gate to an input path for the clock signal, control means connected to a second input of each gate, and means connecting outputs of the gates in common to an output path for the delayed clock signal, the said means connecting inputs and outputs of the gates to respective input and output paths being arranged to provide paths of different respective lengths via different gates, in use the control means applying control signals to the gates to select a path and a corresponding delay for the clock signal.

This preferred feature of the present invention uses an array of logic gates to provide an electronic channel selector suitable for an integrated construction, and capable of quick reconfiguration. This channel selector is not limited in applicability to receivers in accordance with the first aspect of the present invention, but may be used with other receiver designs, or in node transmitters. In particular, it may be combined with a local optical source in a receiver in which an all-optical switch was used in place of the electro-optic modulator of the first aspect of the invention.

Preferably at least one of the said means connecting inputs and outputs comprises a microstrip delay line. Preferably the means connecting inputs and outputs comprise a pair of microstrip delay lines and the gates are connected between the pair of microstrip delay lines.

Preferably adjacent connections to the gates on the microstrip delay line on the input side of the gates are separated by a path length corresponding to t/2 and adjacent connections on the microstrip delay line on the output side of the gates are separated by a path length corresponding to t/2, in use the gates being controlled to vary the delay by multiples of t, where t corresponds to the channel spacing in the time domain of the TDMA signal.

Preferably the optical transmission medium is an optical bus, and more preferably hs an optical bus topology.

As set out in further detail in the description of the embodiments below, the use of dark pulse generation is found to be particularly well-adapted to a network using a bus-topology. This allows the dark pulse generators in the different nodes to be effectively coupled in series so as to build up an OTDM multiplex. At the same time, the bus topology eliminates many of the timing problems associated with other topologies, such as star networks.

According to a second aspect of the present invention there is provided a method of operating an optical network including a plurality of nodes connected to an optical transmission medium, the method comprising:

a) at one of the plurality of nodes, imposing dark pulses representing a data stream on an optical signal which is carried on the optical transmission medium; and b) at a subsequent node, receiving the optical signal including the dark pulses imposed in step (a) and imposing dark pulses on the optical signal in a different respective time slot, thereby creating an OTDM (optical time division multiplexed) signal.

BRIEF DESCRIPTION OF THE DRAWINGS

The present invention also encompasses an optical network incorporating a receiver in accordance with the preceding aspects and also LANs and other computer networks formed using such a network.

Systems embodying the present invention will now be described in further detail, by way of example only, with reference to the accompanying drawings in which.

DETAILED DESCRIPTION OF EXEMPLARY EMBODIMENTS

Figure 1:
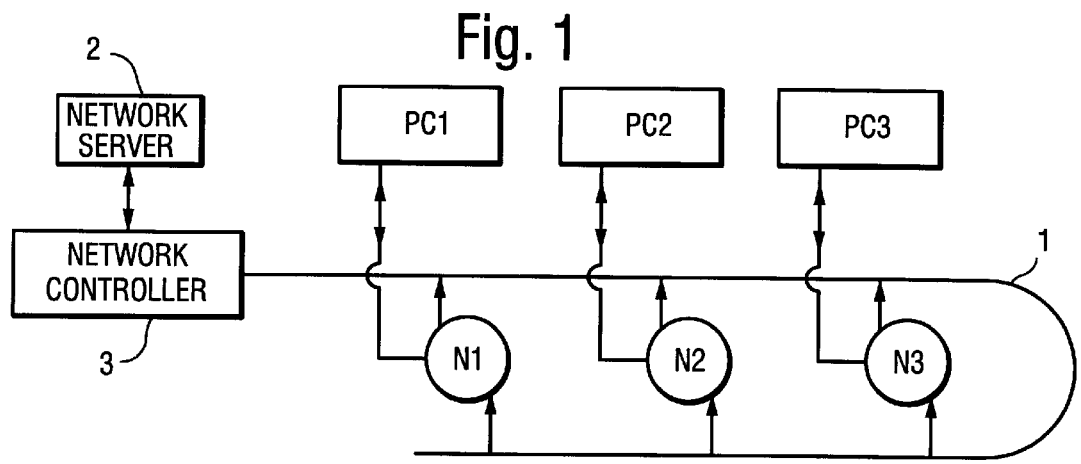
FIG. 1 is a schematic of an optical network.
Figure 2:
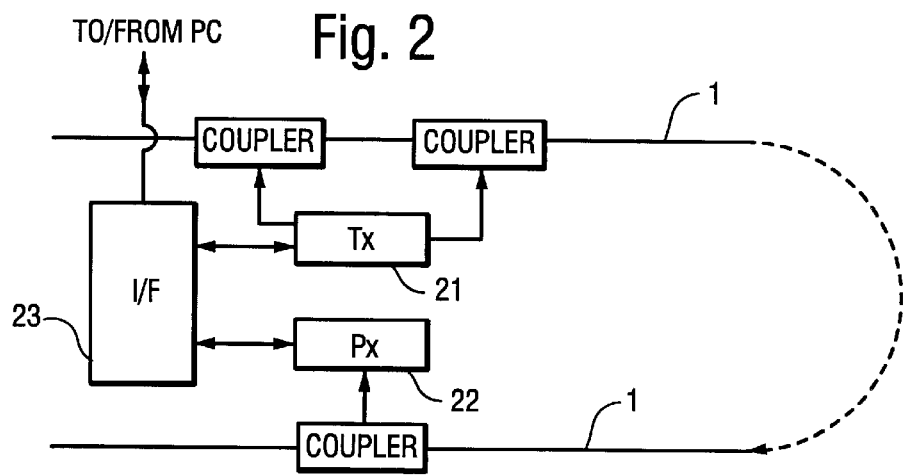
FIG. 2 is a diagram showing the structure of one of the nodes of FIG. 1.

An optical network comprises a number of nodes N1, N2, N3 . . . connected to an optical fibre bus 1. In the present example, the network is a local area network (LAN) and a number of personal computers PC1, PC2, PC3 . . . are connected via the optical fibre bus to each other and to a network server 2. Although, for clarity, only three nodes are shown, in practice the network may support many more nodes. The network uses a structure termed by the inventors a re-entrant bus topology. As seen in FIG. 2, each node includes a transmitter 21 coupled to the bus 1 at two points and a receiver 22 coupled to the fibre bus 1 at a point downstream from the transmitter. The transmitter 21 and receiver 22 are coupled to the respective personal computer by an electronic interface 23.

The network operates using a synchronous TDMA (time division multiple access) protocol. A clock stream is distributed to all users of the network thereby ensuring that each node is synchronised. A clock pulse marks the start of each frame. The frame is precisely divided into time-slots—for example slots of 10 ps duration for a 100 Gbit/s line rate. In general each node has a tuneable transmitter and tuneable receiver and can thereby transmit and receive in any of the time-slots. The granularity of the network, that is the relationship between the overall network bandwidth, and the bandwidth of individual channels, may be chosen to be relatively high so that each user has access to a relatively low speed (say 155 Mbit/s) channel from a fibre optic pipe which itself carries rates in excess of 100 Gbit/s. To minimise the costs of the electronic components required, the electronic speeds within each node are at most 2.5 Gbit/s in this example. The clock source is typically located at the network controller 3 associated with the server 2. The clock produces a regular stream of picosecond duration optical pulses at a low repetition rate, say 155 or 250 MHz, relative to the peak line rate of the optical pipe (100 Gbit/s). Such a source may be provided by a mode-locked laser or a gain-switched laser with external pulse compression. As a guideline, for a 100 Gbit/s LAN a pulse duration of around 2 ps is required whereas for a 40 Gbit/s system around 5–7 ps suffices. A pulse source suitable for operation at 100 Gbit/s or higher is disclosed and claimed in the present applicant's co-pending European Patent Application filed Feb. 16, 1996 and entitled "Optical Pulse Source"

Figure 8:
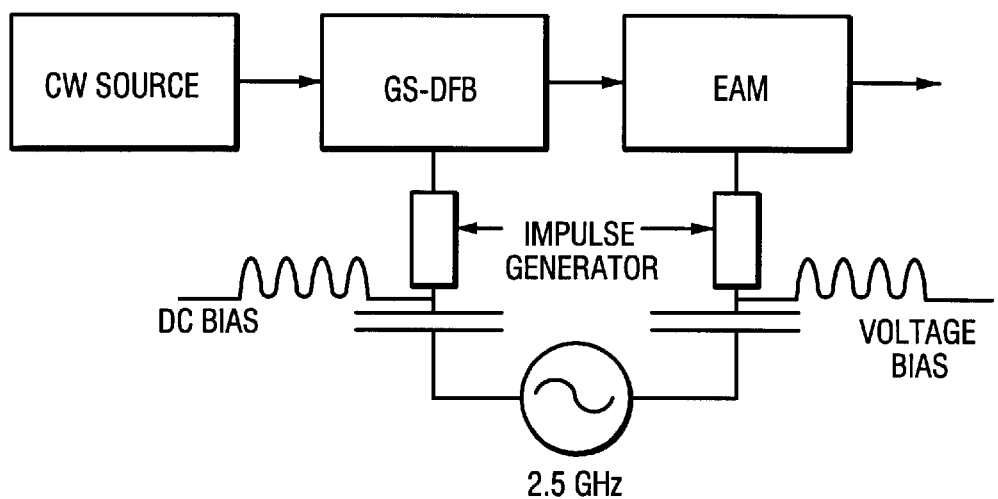
FIG. 8 is a schematic of a pulse source

(applicant's ref. A25146). The disclosures of that earlier application are incorporated herein by reference. This pulse source may comprise a ridge-waveguide gain-switched distributed feedback semiconductor laser diode (DFB-SLD) having its output gated by an electro-absorption modulator. Continuous wave (cw) light is injected into the optical cavity of the DFB-SLD. A synchronised RF drive is applied to the DFB-SLD and to the EAM. This pulse source is shown schematically in FIG. 8.

Figure 3:
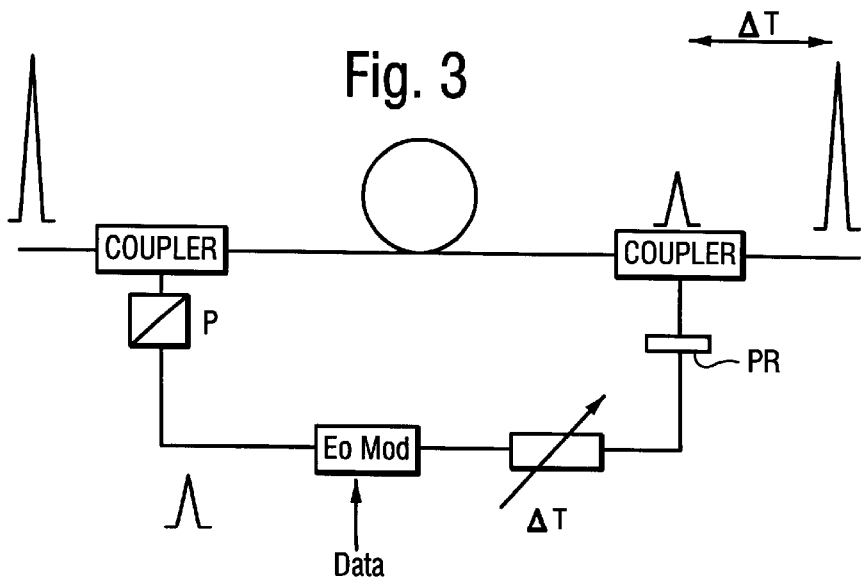
FIG. 3 is a schematic of a transmitter for use in the network of FIG. 1.

FIG. 3 shows the transmitter in one of the nodes. At the transmitter, a fraction of the distributed clock stream is split-off and then encoded via an electro-optic modulator. This may be, for example, a lithium niobate modulator such as that available commercially from United Technologies, model no. APE MZM-1.5-3-T-1-1-B/C, or an electro-absorption modulator (EAM). A suitable EAM is described in the paper by D. G. Moodie et al published at pp 1370–1371 Electron. Letts., 3 August 1995, Vol 31, no. 16. The variable time delay in the transmitter then places the modulated pulse stream into the correct time slot for onward transmission. The data and clock streams must be distinguishable, and in this example polarisation is used to distinguish the clock from the rest of the frame. In the transmitter, a polariser P eliminates the possibility of data channels breaking through and being modulated in the electro-optic modulator (EOmod). The polariser need not be a separate device but might be integrated with the EO modulator. For example, the United Technologies EAM referred to above is inherently polarisation-selective in operation. The delay line provides the required delay and data pulses are inserted into the appropriate time-slot with a polarisation orthogonal to the clock stream. This polarisation rotation may be done via a simple polarisation rotator such as a retardation plate or, where polarisation maintaining fibre is used to implement the circuit, then rotation may be achieved by physically rotating the waveguide before reinserting it into the fibre optic pipe.

At the receiver, after tapping a fraction of the light from the optical pipe, the clock and the data are separated. A polarising beam splitter (PBS) is used to perform this function. The clock and the data pulses are then forced to suffer a relative (programmable) optical delay using a variable time delay device. This means that the clock pulse can be temporally overlapped with any data pulse slot and therefore used to demultiplex or read any channel. After the channel is demultiplexed, it is converted back into the electrical domain using a receiver operating at up to 2.5 Gbit/s, the allocated bandwidth per user.

Figure 4:
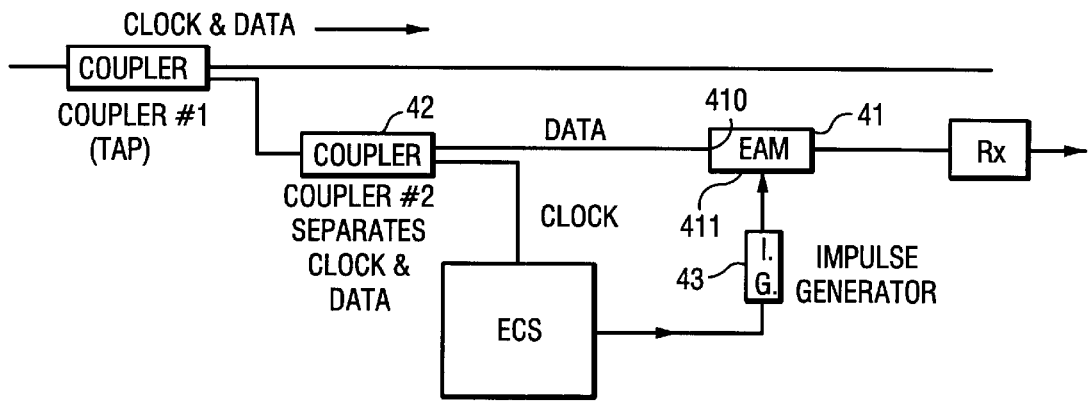
FIG. 4 is a schematic of a receiver for use in the network of FIG. 1.
Figure 5:
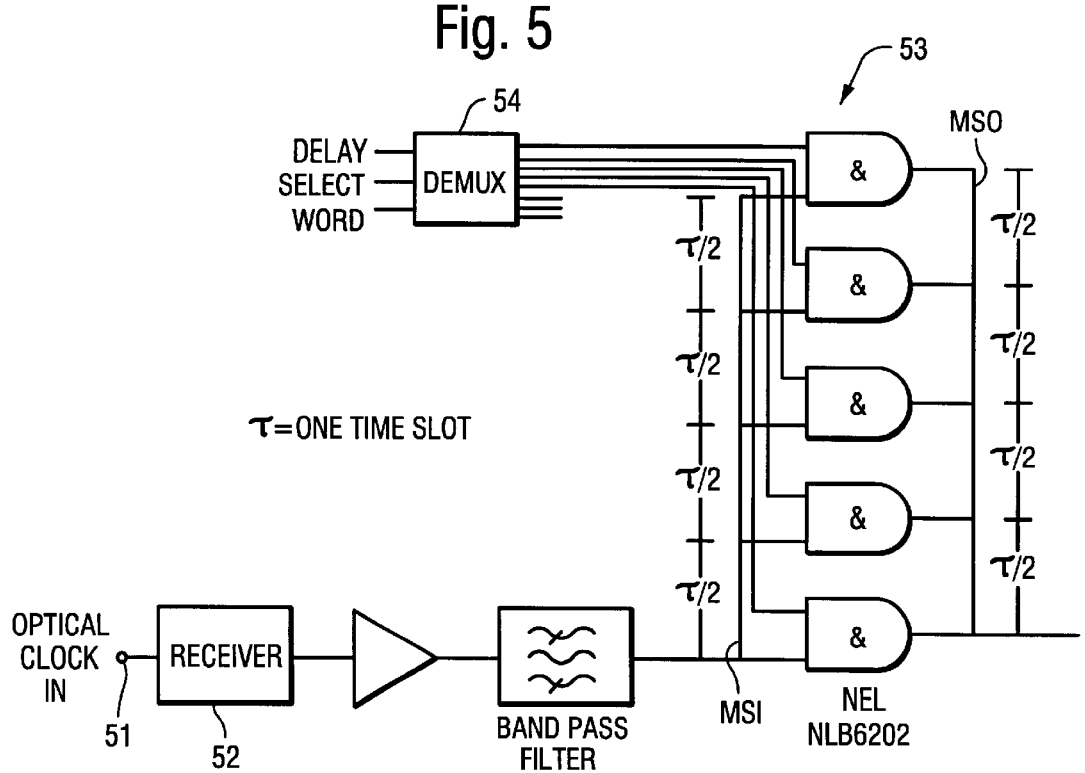
FIG. 5 is a circuit diagram for an electrical channel selector.

FIG. 4 shows in detail the structure of the receiver and in particular shows how an electrical channel selector (ECS) is used to provide a signal which, after suitable amplification and shaping drives an electro-absorption modulator (EAM). The electrical channel selector (ECS) is shown in FIG. 5. The optical LAN clock is first detected using a detector 52 which might be, for example, a PIN photodiode. After amplification, the signal is filtered to generate a clean electrical sine wave. The signal is then input to a delay stages 53 comprising a series of electrical AND gates LG arranged in a linear array. The array is implemented as a single low cost chip available commercially as NEL NLB6202. The AND gates control access to the microstrip delay lines. The delay lines are accurately stepped in delays equal to the channel separation of the LAN. For a system operating at 40 Gbit/s, the channel delay t equals 25 ps. The AND gates are controlled via an input from a demultiplexer 54. In this example the demultiplexer is an NL4705) device manufactured by NEL. The demultiplexer converts an incoming serial delay select word generated by the PC connected to the node into an appropriate gating signal for the AND gate array and thereby selects the appropriate delay.

The electrical channel selector produces at its output a stepped sine wave. This may then be amplified and suitably shaped in order to generate the appropriate drive signal required for the next stage. The next stage may be, for example, an EAM, or a laser diode. If the pulses output by the ECS require shortening to drive the next component, then an electrical impulse generator may be used. A suitable coaxial step recovery diode comb generator is available commercially as ELISRA series MW15900. Given that electronic clock recovery can be carried out with sub-picosecond temporal jitter and microstrip delay lines can be controlled to picosecond accuracy, it is potentially possible to use such an electrical channel selector at rates as high as 100 Gbit/s.

Figure 6:
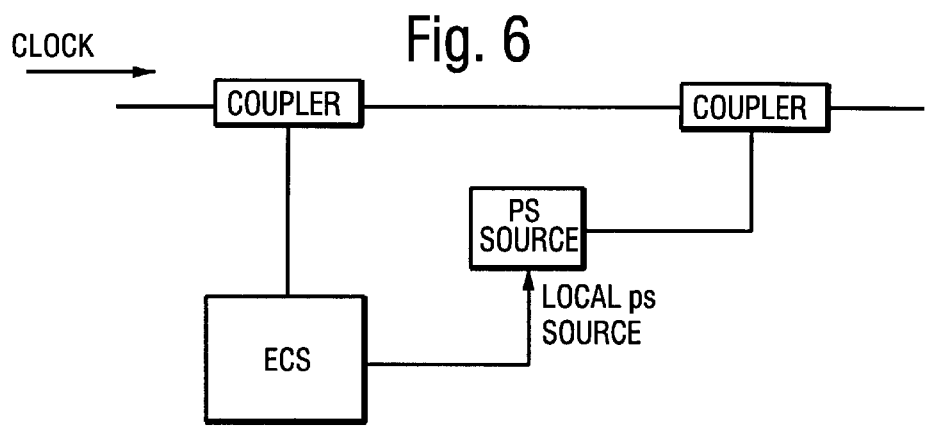
FIG. 6 is a diagram illustrating the use of the electrical channel selector with a local optical source.
Figure 7:
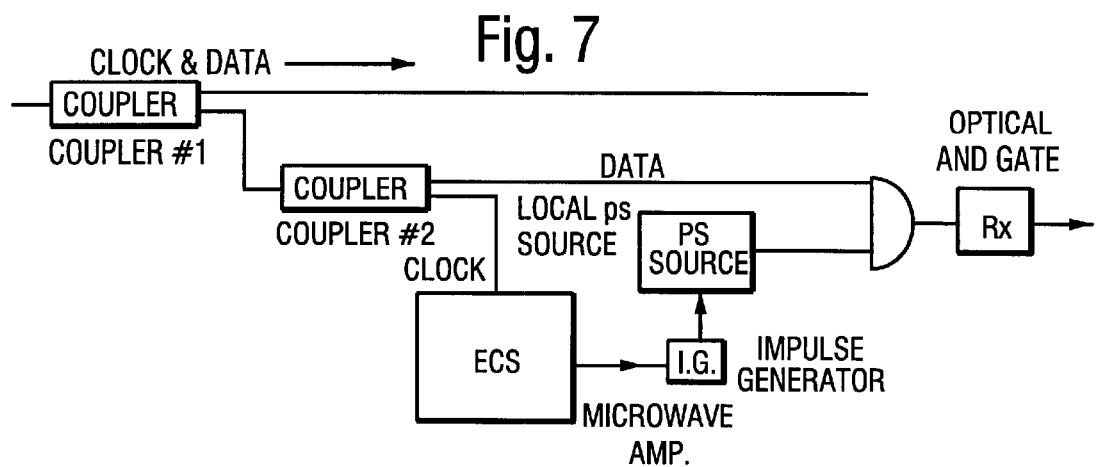
FIG. 7 is a detailed schematic of a receiver based on the topology of FIG. 6.

Although the circuit of FIG. 4 uses an EAM, the ECS might alternatively be used in combination with a local optical source. With such a source, the ECS may be used either in the transmitter for programmable channel insertion (FIG. 6), or in the receiver for channel dropping (FIG. 7). In the case of channel dropping, the output of the local picosecond pulse laser is combined with the data in an optical AND gate. Advances in picosecond pulse lasers in recent years are such that it is possible to generate stable picosecond duration optical pulses using semiconductor based active media. One example of such a laser is a gain-switched DFB laser followed by chirp compensation as described in our above-cited copending application. This provides a simple reliable source of picosecond duration pulses at flexible repetition rates from MHz to 10 s of GHz. In the present example, such a source is driven by the output of the ECS after broadband amplification and using an impulse generator. The resulting stream of optical pulses is then used directly to demultiplex the required channel in an optical AND gate. The use of an optical AND gate as a demultiplexer is described in detail in the present Applicant's earlier International Application no. PCT/GB 95/00425, filed Feb. 28, 1995. The wavelength of the source depends on the design of the optical AND gate, but is not at all restricted to be the same as the data wavelength. The optical AND gate may be an SLA-NOLM or may be an integrated semiconductor-based device.

The systems so far described have used what may be termed "bright pulses" to carry information. Advantageously, dark pulses may be used instead. A convenient system for generating dark pulses will now be described. Initially the description covers the case of a system incorporating only one EAM. Typically, however, more than one EAM would be utilised, as described in more detail below.

Figure 9:
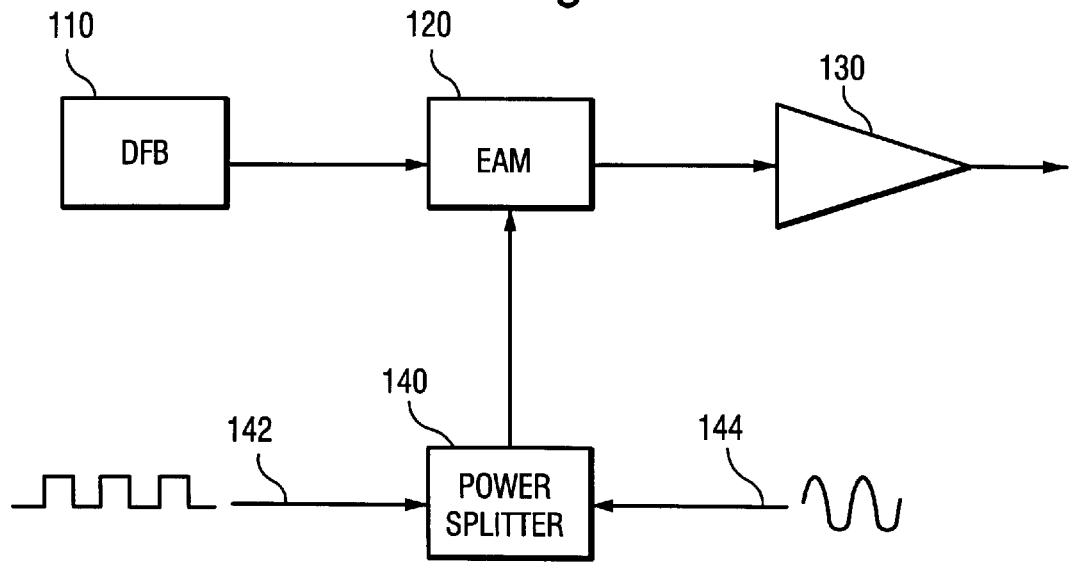
FIG. 9 illustrates a dark pulse generator incorporating one EAM.

In FIG. 9, a 1555 nm DFB laser source 110 is coupled into an EAM 120 with a power level of −2 dBm. The EAM has a maximum extinction ratio of 20 dB and a mean absorption characteristic of 2.5 dB/V. A 10 GHz sinewave drive 142 is synchronised with and passively added to a 10 Gbit/s data sequence from a data source 144 via a power splitter 140 (used in reverse to combine the two signals). A suitable power splitter is the Wiltron K240B, available from Anritsu Wiltron. Both the sinewave and data sequence signal levels have a 2.5V peak-to-peak amplitude. The resulting signal comprises a sinewave with an offset voltage determined by the data signal, with the relative amplitudes arranged such that the maximum value of the cycle for a data 0 is below the minimum level for a data 1. It will be appreciated that this precise arrangement is not necessary, and it would be sufficient to ensure that the entire 10 GHz cycle remains in the low absorption region of the modulator for a data 1. The electrical signal is applied to the EAM 120, and the DC bias is adjusted to ensure that the entire cycle for a data 1 gives low extinction, whilst the troughs of the cycle for a data 0 give a high extinction. Consequently, dark-pulses are formed for data 0's, whilst a low extinction is maintained for data 1's.

Figure 10:
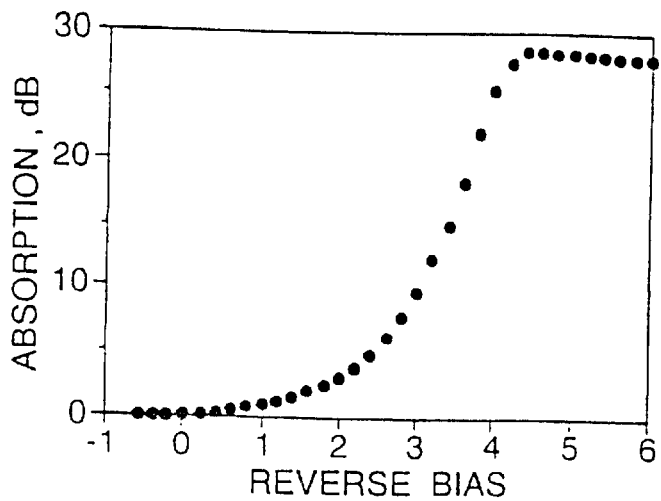
FIG. 10 is a graph representing a typical operational characteristic of an EAM.

An EAM suitable for use in the system is the one described in, for example, "Generation of 6.3 ps optical pulses at a 10 GHz repetition rate using a packaged EAM and dispersion compensating fibre", Electronics Letters, Volume 30, pp 1700–1701, which is incorporated herein by reference. The absorption characteristic of this EAM is reproduced in FIG. 10. In FIG. 10 it can be seen that the EAM has an operating region of low extinction at positive or low negative reverse biases, an operating region of high extinction at high reverse biases, and an exponentially varying operating region in between. It is the exponentially varying operating region of the EAM which supports the generation of soliton-like dark pulses.

Figure 11:
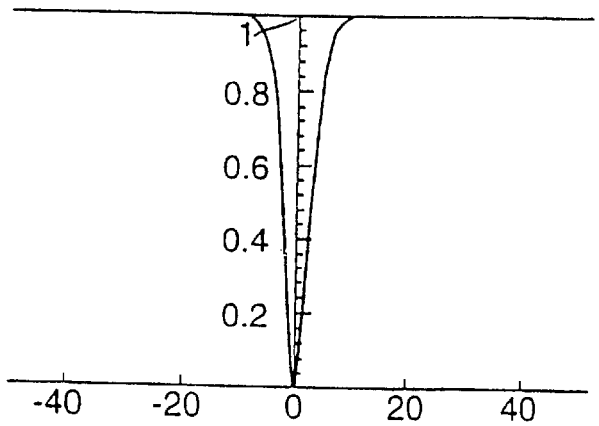
FIG. 11 is a representation of an optical output signal provided by the system in FIG. 9.

In theory, the dark pulses generated should resemble inverted $SECH^2$ pulses (that is to say, inverted solitons) having the form:

$$P(t) = (\text{Peak Power}) \times (1 - SECH(1.76(t/\tau))^2) \quad \text{(equation 1)}$$

where $\tau$ represents the pulse width at half its peak power. In operation, the EAM is electrically biased to remain in its low loss condition unless both data and sinewave are negative. That is to say, the EAM transmits light unless both electrical signal components are negative. Thus, dark pulses are generated corresponding to data zeros, as illustrated in FIG. 11, which closely resemble the theoretical form of equation 1.

Figure 12:
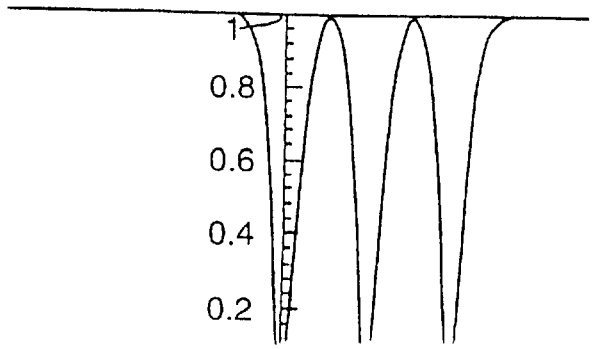
FIG. 12 illustrates a system incorporating three EAMs.
Figure 13:
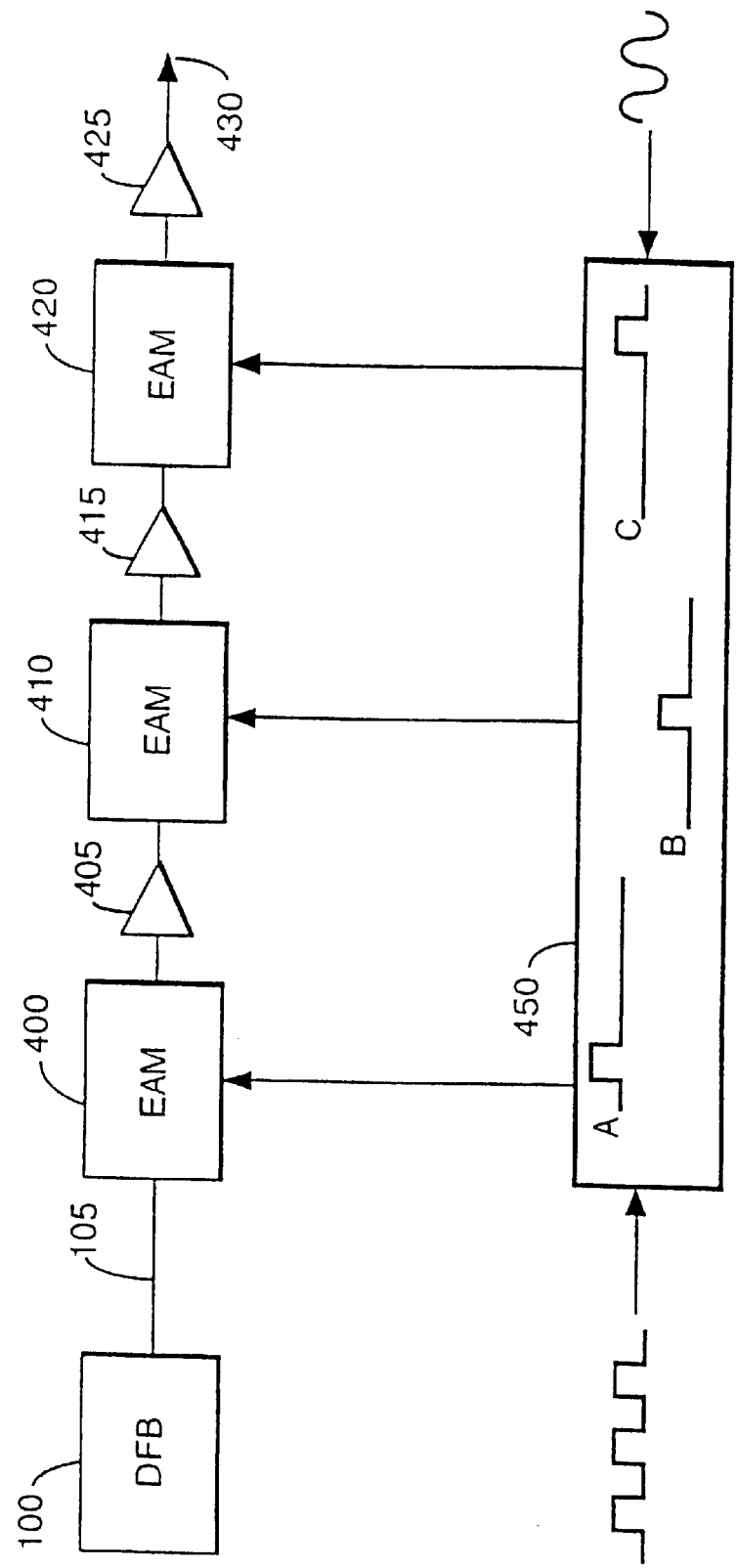
FIG. 13 is an eye diagram of an optical output signal provided by the system in FIG. 12.

FIG. 12 shows a system according to the present invention implementing three EAMs. In the system, three EAMs 400, 410 and 420 are optically cascaded, or are arranged to be in optically coupled alignment, with an optical light source 100, comprising a 1555 nm DFB laser. Conveniently, the laser light is coupled onto the first EAM 400, using a standard telecommunications optical fibre 105, the light having a power level of −2 dBm. In this example, optical amplifiers 405, 415 and 425, for example EDFAs, follow each EAM to compensate for any losses incurred in the EAMs. The amplifiers are only incorporated if necessary to compensate for optical loss incurred by the EAMs. As for the system illustrated in FIG. 9, each EAM is driven by an electrical signal comprising a sinewave component and a data component aligned in data channel slots A, B or C. Since three electrical drive signals are required, electrical timing circuitry 450 is required to ensure that the data signals A, B and C are aligned correctly with the sinewave and are aligned also in the correct slot positions of the required OTDM signal which is output downstream of the third amplifier 425.

The light source can be separate from the modulator, the light from the light source being coupled into the modulator via, for example, an optical fibre as described above. However, in an alternative arrangement the light source and the EAMs are fabricated as an integrated device on a common semiconductor substrate. Apart from convenience, this arrangement has the advantage that coupling loss between each modulator and between the light source and the first modulator is reduced. Also, amplification, if necessary, could be provided by integrating SLAs (semiconductor laser amplifiers) between one or more EAMs.

The skilled person will appreciate that any form of optical, acousto-optic or electro-optic modulator having the necessary transmission and extinction or switching properties to provide dark pulses would be suitable for implementing the present invention.

The electrical bias scheme described above for driving the EAM is particularly advantageous for two reasons. Firstly, only one electrical signal is required to bias each EAM and secondly the electrical signal does not require any electrical processing. Electrical processing would be required if using the method described in "Generation of 2.5 Gbit/s soliton data stream with an integrated laser modulator transmitter", Electronics Letters, Volume 30, pp 1880–1881.

EAMs suffer some optical loss even when operating in their low optical loss regions. The amount of optical loss of an EAM is partly determined by the length of the optical modulator section through which light from a light source travels. Thus, in known modulator schemes comprising two modulators or multiple modulator sections, which firstly generate an optical pulse stream using an electrical sinewave drive signal, and secondly modulate data onto the pulse stream using an electrical data signal, both modulators, or both modulator sections, incur an optical insertion loss. In that the proposed system only implements one modulator (section) per data channel, the system intrinsically incurs a lower insertion loss overhead, regardless of the type of modulator used, than other schemes incorporating more than one modulator, or modulator section, to generate one data channel.

As described above, the optical radiation is in the form of a substantially continuous burst. The duration of the burst depends on the application. For the example of a trunk communications network, where traffic is likely to be present at most times, the optical source might remain on all the time. Alternatively, for a less busy optical link, the source might be switched on only when transmission of data, or part thereof (for a packet switched network for example), is required. Therefore, 'substantially continuous' might be interpreted as continuous during data transmission.

Alternatively, the cw light input into the first EAM can be substituted for an optical clock, for example a sinewave or pulse stream. Then, with the same general system arrangement used for dark pulse generation, each EAM can be used to modulate one time slot of the optical clock. That is to say, each EAM is arranged either to transmit, or prevent transmission, of light (the peaks or bright pulse portions of the clock signal) depending on the data-encoding requirements of its designated data channel. For example, for a 100 Gbit/s optical clock pulse stream, ten EAMs may be cascaded to encode ten 10 Gbit/s channels. Also, one or more EAMs operating according to this arrangement may be used as data-insert devices for one or more channels in an OTDM system. The skilled person would easily be able to implement data modulation or an insert function by applying the theory disclosed by the present description.

The skilled person will also appreciate that the level-shifted sinewave bias signal described above for generating dark pulses would be suitable for generating bright pulses when applied to a single electrical input EAM. The electrical signal would in this case need to be arranged to maintain the EAM in its high optical extinction state unless both data and sinewave components were positive. Such an arrangement would obviate the need for electrical signal processing to generate a suitable bias signal, and would thus be a simple and robust solution. Thus, this arrangement could be used for generation of solitons or a conventional OTDM signal.

Figure 14:
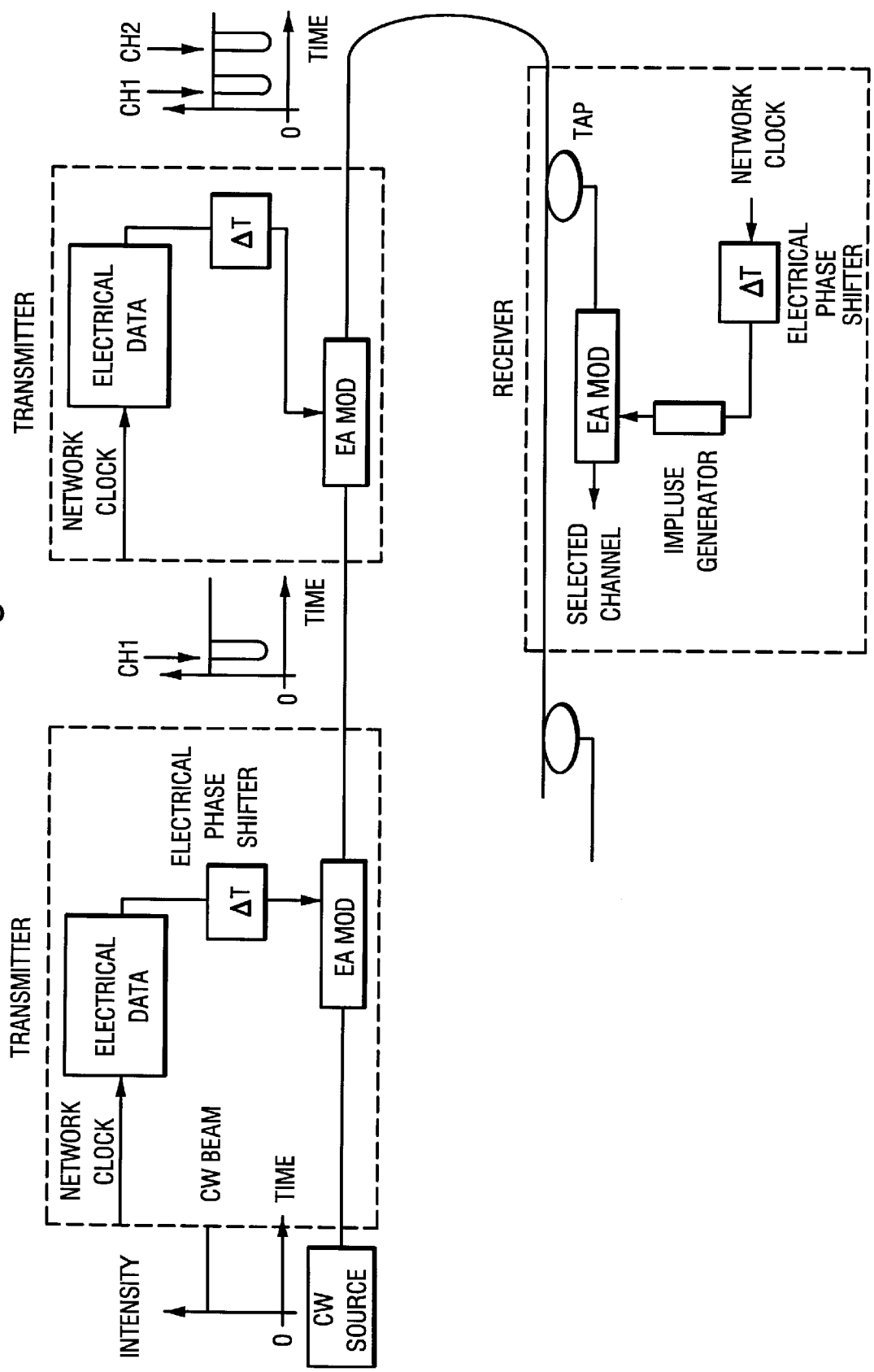
FIG. 14 is a schematic of an optical fibre LAN incorporating dark pulse generators.
Figure 15A:
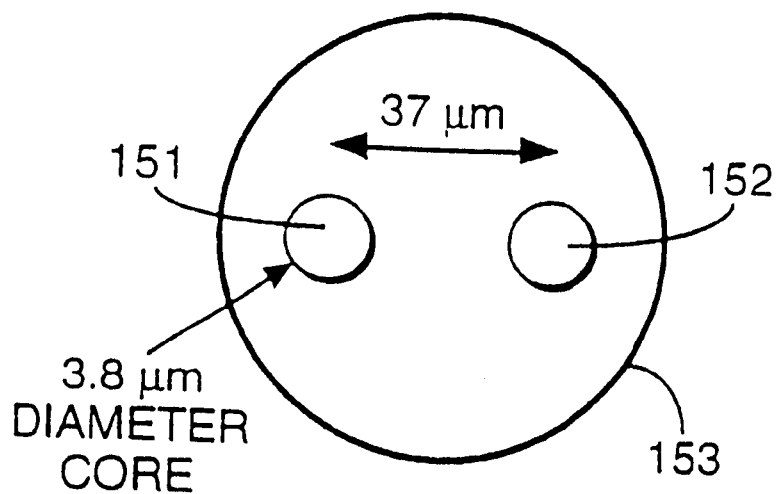
FIGS. 15a and 15b show fibre waveguides for use in the LAN of FIG. 14.
Figure 15B:
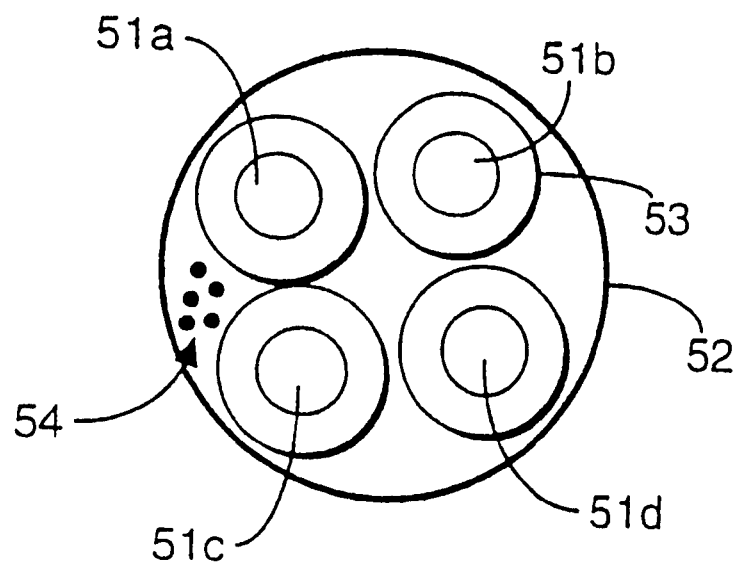

FIG. 14 shows dark pulse generators incorporated in a network using the re-entrant bus topology described previously. It differs from the networks considered previously, in that the time-slot into which data is added at a node transmitter can be chosen in the electrical domain. Each node transmitter has a respective EAM connected in-line with the optical fibre and with the EAM's of other node transmitters. By contrast, in the receivers, the EAM's do not need to be in-line, and preferably are connected to the optical fibre by an optical tap in order to optimise the power budget. As described above, and in our co-pending European patent application no. 96301277.8 filed Feb. 26, 1996, the contents of which are incorporated herein by reference, the network clock may be distributed along the optical fibre bus using a different polarisation state to distinguish it from the optical data on the bus. It is preferred however that the bus should comprise two co-located optical fibre waveguides, with one of the two waveguides dedicated to carrying the clock signal, as described in our co-pending European patent application no. 96304694.1 filed Jun. 26, 1996, also incorporated herein by reference. As shown in FIG. 15a, the two waveguides may be provided by twin cores 151, 152 within a single optical fibre 153. Alternatively, as shown in FIG. 15b, two or more optical fibres 51a–51d may be co-located within a single sheath 53 using e.g a blown fibre cable construction including aramid yarn reinforcement 54. The optical signal for modulation by the EAM of the dark pulse generator is then transmitted down one of the waveguides while the network clock signal is transmitted down another of the waveguides. The network clock does not need necessarily to be a short optical pulse, since in this embodiment the clock is not modulated directly to produce the data channels. A relatively broad optical pulse. or modulation of a CW beam may be used to generate the clock. The network clock is converted to the electrical domain and a variable delay applied in order to generate a control signal for the EAM in the appropriate respective time slot. This signal is modulated with RZ data received, for example, from a PC data interface of the type previously described. If the electrical data is originally in an NRZ format, then conversion to RZ with a low duty cycle is required in order to produce narrow dark pulses.

What is claimed is:

1. An optical network comprising:
    a) an optical transmission medium; and
    b) a plurality of nodes connected to the optical transmission medium, each of the plurality of nodes including a respective dark pulse generator which is coupled in-line with the optical transmission medium and in series with the others of the dark pulse generators and which is arranged to generate dark pulses in an optical signal carried on the transmission medium;
    wherein each node further comprises a variable delay stage which is arranged to apply a variable delay to a network clock signal in the electrical domain and which is connected at its output to the dark pulse generator.

2. A optical network according to claim 1, in which each node further comprises a clock receiver for receiving a network clock signal carried on the optical transmission medium, the clock receiver including a photoelectric detector for converting the clock signal to the electrical domain.

3. A optical network according to claim 1 in which said optical transmission medium is an optical bus and a plurality of node transmitters are coupled to an upstream portion of the optical bus.

4. An optical network according to claim 3, in which at least one of said nodes comprises:
    a node transmitter coupled to an upstream portion of the optical bus; and
    a respective node receiver coupled to a downstream portion of the optical bus.

5. An optical network according to claim 4, in which each of said dark pulse generators comprises a single optical modulator.

6. An optical network according to claim 5, wherein each of said generators is an electro-absorption modulator.

7. An optical network according to claim 1 in which the variable delay stage comprises:
    a plurality of logic gates,
    means connecting a first input of each gate to an input path for the clock signal,
    control means connected to a second input of each gate, and
    means connecting outputs of the gates in common to an output path for the delayed clock signal, said means connecting inputs and outputs of the gates to respective inputs and output paths being arranged to provide paths of different respective lengths via different gates, in use the control means applying control signals to the gates to select a path and a corresponding delay for the clock signal.

8. An optical network according to claim 1 including a source of substantially continuous bursts of optical radiation coupled to the optical transmission medium upstream of node transmitters.

9. An optical network according to claim 1, in which the network has a re-entrant bus topology.

10. An optical network according to claim 1, in which the optical transmission medium includes a plurality of co-located waveguides.

11. An optical network comprising:
    a) an optical transmission medium; and
    b) a plurality of nodes connected to the optical transmission medium, each of the plurality of nodes including a respective dark pulse generator which is coupled in-line with the optical transmission medium and in series with the others of the dark pulse generators and which is arranged to generate dark pulses in an optical signal carried on the transmission medium;
    wherein each of the nodes includes a node receiver, each node receiver comprising:
        i) an input for an optical clock signal,
        ii) a detector for converting the clock signal to the electrical domain,
        iii) a variable delay stage for applying a selected delay to the clock signal in the electrical domain, and
        iv) a non-linear electro-optic modulator including an optical input arranged to receive an optical TDMA datastream and an electrical control input connected to the output of the variable delay stage, in use the electro-optic modulator outputting a TDMA channel selected by setting the delay of the variable delay stage.

12. A network interconnecting a plurality of computer systems and comprising an optical network, said optical network comprising:
    a) an optical transmission medium; and
    b) a plurality of nodes connected to the optical transmission medium, each of the plurality of nodes including a respective dark pulse generator which is coupled in-line with the optical transmission medium and in series with the others of the dark pulse generators and which is arranged to generate dark pulses in an optical signal carried on the transmission medium;
    wherein each node further comprises a variable delay stage which is arranged to apply a variable delay to a network clock signal in the electrical domain and which is connected at its output to the dark pulse generator.

13. A method of operating an optical network including a plurality of nodes connected to an optical transmission medium, the method comprising:
   a) at one of the plurality of nodes, imposing dark pulses representing a data stream on an optical signal which is carried on the optical transmission medium;
   b) at a subsequent node, receiving the optical signal including the dark pulses imposed in step (a) and imposing dark pulses on the optical signal in a different respective time slot, thereby creating an OTDM (optical time division multiplexed) signal;
   c) applying a variable delay to a network clock signal in the electrical domain, and
   d) applying a resulting signal as a control input to an electro-optic modulator, the electro-optic modulator thereby generating said dark pulses.

14. A method according to claim 13, in which said optical signal received at one of the plurality of nodes in step (a) comprises a continuous burst of optical radiation.

15. A method of operating an optical network including a plurality of nodes connected to an optical transmission medium, the method comprising:
   a) at one of the plurality of nodes, imposing dark pulses representing a data stream on an optical signal which is carried on the optical transmission medium; and
   b) at a subsequent node, receiving the optical signal including the dark pulses imposed in step (a) and imposing dark pulses on the optical signal in a different respective time slot, thereby creating an OTDM (optical time division multiplexed) signal;
   wherein said optical signal comprises an optical clock signal onto which data is imposed by arranging at least one dark pulse generator to block peaks of the optical clock signal.

* * * * *